United States Patent
Nagano

(10) Patent No.: US 7,884,415 B2
(45) Date of Patent: Feb. 8, 2011

(54) SEMICONDUCTOR MEMORY DEVICE HAVING MULTIPLE AIR GAPS IN INTERELECTRODE INSULATING FILM

(75) Inventor: Hajime Nagano, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/405,457

(22) Filed: Mar. 17, 2009

(65) Prior Publication Data
US 2009/0302367 A1 Dec. 10, 2009

(30) Foreign Application Priority Data
Jun. 10, 2008 (JP) ............... 2008-151625

(51) Int. Cl.
*H01L 29/788* (2006.01)
*H01L 29/76* (2006.01)
*H01L 21/3205* (2006.01)
*H01L 21/4763* (2006.01)

(52) U.S. Cl. ............... 257/316; 257/314; 257/315; 257/317; 438/593

(58) Field of Classification Search .............. 257/316, 257/317
See application file for complete search history.

(56) References Cited

U.S. PATENT DOCUMENTS 7,573,092 B2 * 8/2009 Matsui et al. ............... 257/316

| | | |
|---|---|---|
| 2002/0036349 A1 | 3/2002 | Saito et al. |
| 2005/0045941 A1 * | 3/2005 | Kurita et al. ............ 257/315 |
| 2006/0231884 A1 | 10/2006 | Yonemochi et al. |
| 2007/0096202 A1 | 5/2007 | Kang et al. |
| 2007/0132007 A1 * | 6/2007 | Kamigaichi et al. ......... 257/316 |
| 2009/0001444 A1 * | 1/2009 | Matsuoka et al. .......... 257/316 |
| 2009/0087977 A1 * | 4/2009 | Spuller et al. ............ 438/593 |
| 2009/0108333 A1 * | 4/2009 | Kito et al. .................. 257/324 |

FOREIGN PATENT DOCUMENTS

| JP | 2006-302950 | 11/2006 |
|---|---|---|
| JP | 2007-157927 | 6/2007 |

* cited by examiner

Primary Examiner—N Drew Richards
Assistant Examiner—Michael Jung
(74) Attorney, Agent, or Firm—Oblon, Spivak, McClelland, Maier & Neustadt, L.L.P.

(57) ABSTRACT

In a semiconductor device, each of a plurality of floating gate electrodes has an upper end, a lower end and an intermediate portion between the upper and lower ends and is formed so that the intermediate portion has a smaller length in a gate-length direction than each of the upper and lower ends. Each of a plurality of control gate electrodes has an upper end, a lower end and an intermediate portion between the upper and lower ends and is formed so that the intermediate portion has a smaller length in a gate-length direction than each of the upper and lower ends. Each of a plurality of inter-electrode insulating films includes a first air gap formed in a first portion corresponding to the intermediate portion of each floating gate electrode and a second air gap formed in a second portion corresponding to the intermediate portion of each control gate electrode.

6 Claims, 8 Drawing Sheets

SEMICONDUCTOR MEMORY DEVICE HAVING MULTIPLE AIR GAPS IN INTERELECTRODE INSULATING FILM

CROSS-REFERENCE TO RELATED APPLICATIONS

This application is based on and claims the benefit of priority from the prior Japanese Patent Application No. 2008-151625, filed on Jun. 10, 2008, the entire contents of which are incorporated herein by reference.

BACKGROUND OF THE INVENTION

1. Field of the Invention

The present invention relates to a method of fabricating a semiconductor device which is configured to have an air gap defined between adjacent memory cells, and the semiconductor device fabricated by the method.

2. Description of the Related Art

A flash memory can maintain stored data even without power supply thereto and have accordingly been widely used as a memory element for a multimedia card. The memory capacity of the flash memory has recently been desired to be increased. For this purpose, high integration of memory cells is further necessitated. Technical problems posed by high integration of memory cells include an increase in a capacitance between cells adjacent to each other. A silicon oxide is buried between gate electrodes of adjacent memory cells as an insulator in an ordinary structure of the memory element. The silicon oxide can be formed easily and has a dielectric constant that is about half of that of a silicon nitride, so that the silicon oxide can reduce a capacitance between adjacent memory cells. However, a capacitance between adjacent memory cells is increased in inverse proportion to a distance therebetween as an interval of memory cells is reduced. As a result, an operating speed of the memory element is reduced and a malfunction (in data write and/or readout) occurs.

In view of the above-described problem, the conventional art has suggested a configuration in which nothing is formed between gate electrodes of adjacent memory cells, that is, a configuration in which an air gap with a minimum dielectric constant is defined, in order that the capacity between adjacent memory cells may be reduced (see Japanese patent application publication JP-A-2007-157927). An air gap has conventionally been formed by covering an upper part of each gate electrode when a silicon oxide film is buried between the gate electrodes. However, it has been difficult to form an air gap controllably by the conventional method.

BRIEF SUMMARY OF THE INVENTION

According to one embodiment, there is provided a semiconductor device comprising a semiconductor substrate; a gate insulating film formed on an upper surface of the semiconductor substrate; a plurality of gate electrodes each of which includes a floating gate electrode formed on the gate insulating film, an intergate insulating film formed on the floating gate electrode, and a control gate electrode formed on the intergate insulating film; a plurality of inter-electrode insulating films formed on portions of the semiconductor substrate located between the plurality of gate electrodes, wherein each floating gate electrode has an upper end, a lower end and an intermediate portion between the upper and lower ends and is formed so that the intermediate portion of each floating gate electrode has a smaller length in a gate-length direction than each of the upper and lower ends of each floating gate electrode; each control gate electrode has an upper end, a lower end and an intermediate portion between the upper and lower ends and is formed so that the intermediate portion of each control gate electrode has a smaller length in a gate-length direction than each of the upper and lower ends of each control gate electrode; each inter-electrode insulating film includes a first air gap portion formed in a first portion thereof corresponding to the intermediate portion of each floating gate electrode and a second air gap portion formed in a second portion thereof corresponding to the intermediate portion of each control gate electrode; and each floating gate electrode includes a first side wall having a first recess and each control gate electrode includes a second side wall having a second recess.

BRIEF DESCRIPTION OF THE DRAWINGS

In the accompanying drawings.

DETAILED DESCRIPTION OF THE INVENTION

Figure 1:
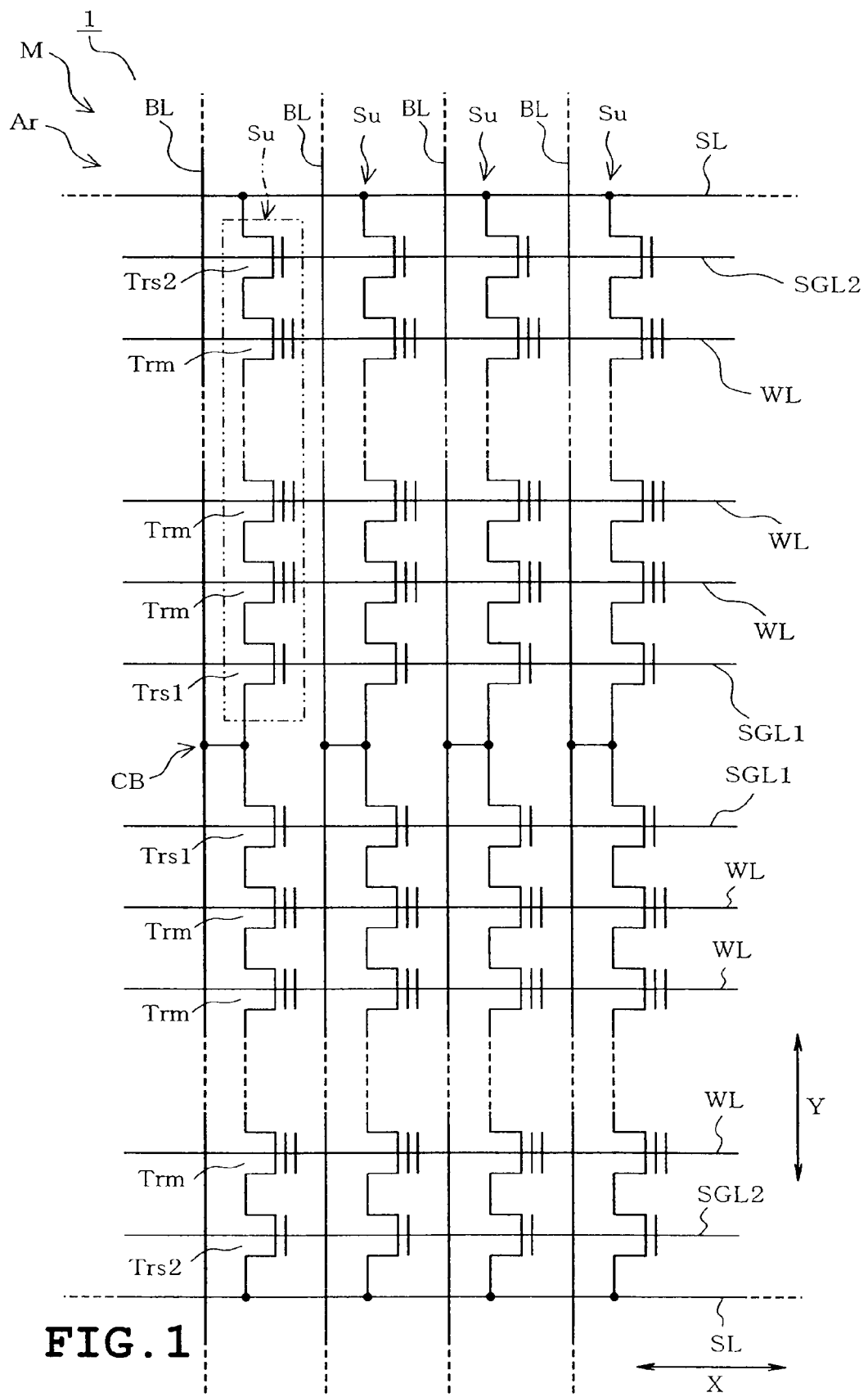
FIG. 1 shows an electrical arrangement of a memory cell region of a NAND flash memory of a first embodiment in accordance with the present invention.

One embodiment of the present invention will be described with reference to the accompanying drawings. The invention is applied to a NAND flash memory in the embodiment. In the following description, identical or similar parts are labeled by the same reference numerals. The drawings typically illustrate the invention, and the relationship between a thickness and plane dimension, layer thickness ratio and the like differ from respective natural dimensions.

Firstly, an electrical arrangement of the NAND flash memory 1 will be described. FIG. 1 shows an equivalent circuit showing a part of memory cell array Ar of the NAND flash memory 1. The memory cell array Ar includes a number of NAND cell units (string units) Su arranged into rows and columns. Each NAND cell unit includes a plurality of or, in the embodiment, two selective gate transistors Trs1 and Trs2 and a plurality of, for example, thirty-two ($2^n$ where n is a positive integer) memory cell transistors Trm series-connected between the selective gate transistors Trs1 and Trs2. Each source/drain region is shared by the adjacent memory cell transistors Trm in each NAND cell unit Su. The memory cell transistors Trm arranged in the X direction in FIG. 1 (corresponding to a direction of word lines or gate width) are connected in common to word lines WL (control gate lines).

Furthermore, the selective gate transistors Trs1 arranged in the X direction in FIG. 1 are connected in common to selective gate lines SGL1, whereas selective gate transistors Trs2 arranged in the X direction in FIG. 1 are connected in common to selective gate lines SGL2.

Bit line contacts CB are connected to drain regions of the selective gate transistors Trs1. The bit line contacts CB are connected to bit lines BL extending in the Y direction (corresponding to a direction of gate length or the bit lines) perpendicular to the X direction in FIG. 1. Furthermore, the selective gate transistors Trs2 are connected via source regions to source lines SL extending in the X direction in FIG. 1.

Figure 2:
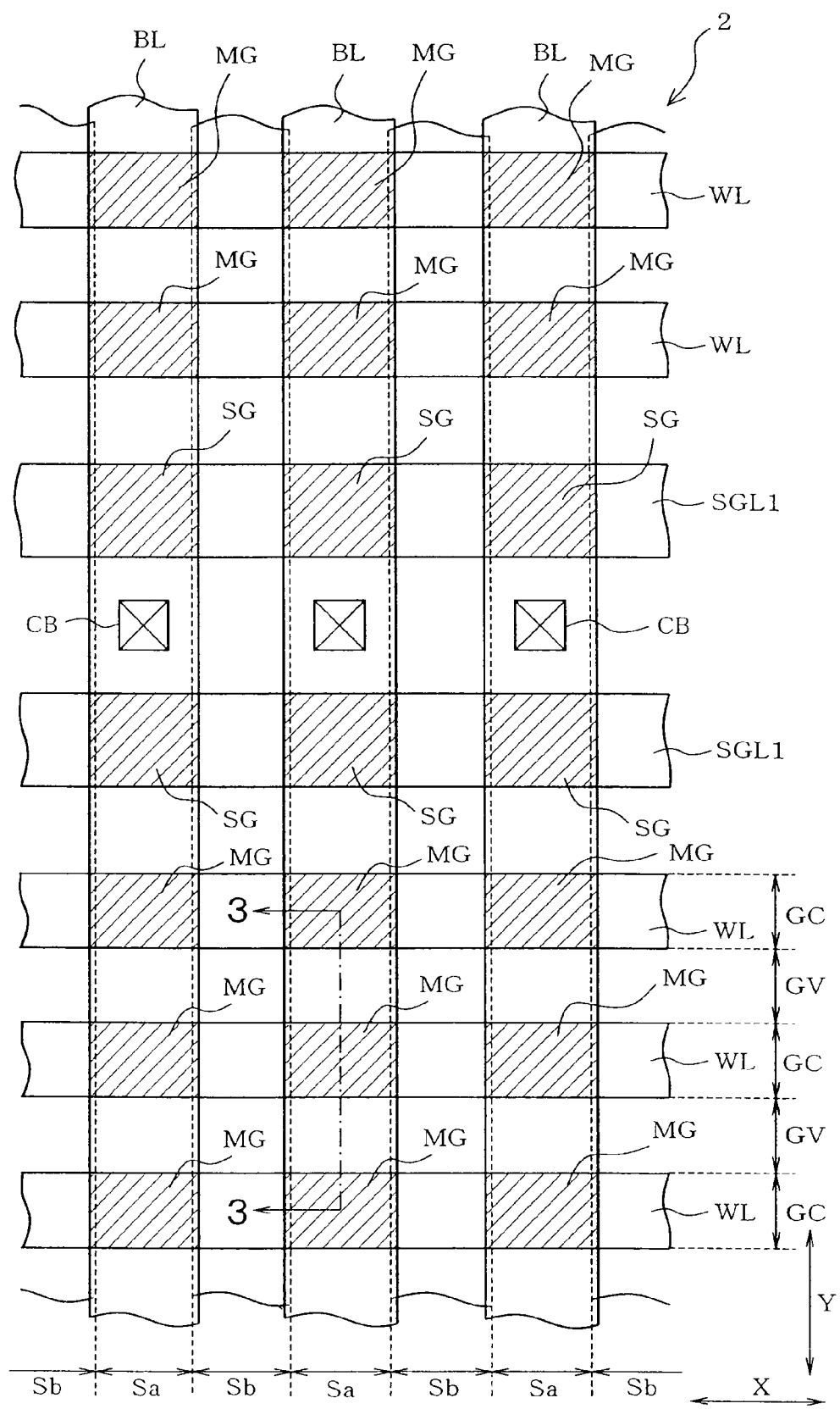
FIG. 2 is a schematic plan view of the memory cell region.
Figure 3:
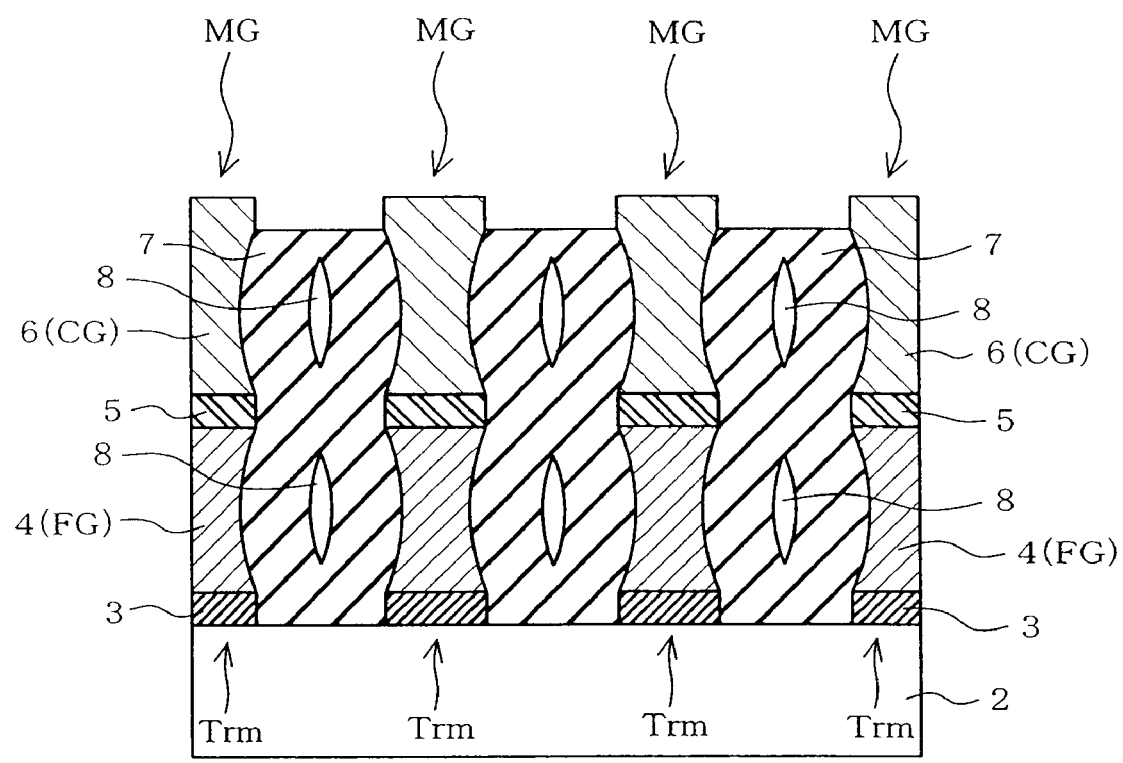
FIG. 3 is a schematic longitudinal side section taken along line 3-3 in FIG. 2.

FIG. 2 illustrates a layout pattern of a part of the memory cell region. FIG. 3 is a schematic section taken along line 3-3 in FIG. 2. A plurality of element isolation regions Sb of a shallow trench isolation (STI) structure are formed in a silicon substrate 2 serving as a semiconductor substrate so as to extend in the Y direction as viewed in FIG. 2. The element isolation regions Sb are formed so as to be drawn up in a plurality of lines at predetermined intervals in the X direction, whereby element regions (active areas) Sa are formed so as to extend in the Y direction and so as to be separated from each other in the X direction in FIG. 2.

A plurality of word lines WL are formed so as to intersect the element regions Sa and so as to be spaced from each other in the Y direction. Furthermore, a pair of selective gate lines SGL1 of the selective gate transistors are formed so as to extend in the X direction in FIG. 2. The bit line contacts CB are formed on the element regions Sa between the selective gate lines SGL1. Gate electrodes MG (corresponding to stacked gate electrodes) of the memory cell transistors Trm are formed on portions of the element regions Sa intersecting the word lines WL. Gate electrodes SG of the selective gate transistors Trs1 and Trs2 are formed on portions of the element regions Sa intersecting the selective gate lines SGL1.

FIG. 3 is a schematic section (a state during fabrication process) taken along line 3-3 in FIG. 2, mainly showing the gate electrodes MG of the memory cell transistors Trm located on the element regions Sa and the peripheral structure. As shown, each gate electrode MG includes a polycrystalline silicon layer 4, an intergate insulating film 5 and a metal silicide layer 6 all of which are sequentially deposited on the silicon substrate 2 with a silicon oxide film 3 being interposed between the silicon substrate 2 and the polycrystalline silicon layer 4. The silicon oxide film 3 is formed by applying a thermal oxidation treatment to the upper surface of the silicon substrate 2. The silicon oxide film 3 serves as a gate insulating film and a tunnel insulating film. The polycrystalline silicon layer 4 is doped with impurities such as phosphor (P) and formed into a floating gate electrode FG. A metal silicide layer 6 is an alloy layer that is formed so as to serve as the control gate electrode CG. The metal silicide layer 6 reduces a resistance value of the word line WL. Each control gate electrode CG may have a double layer structure of a polycrystalline silicon layer and a metal silicide layer, although being composed of a metal silicide layer.

Each intergate insulating film 5 serves both as an insulating film between the floating gate electrode FG and the control gate electrode CG and as an inter-conductive layer of the polycrystalline silicon layer 4 and the metal silicide layer 6. Each intergate insulating film 5 comprises, for example, a deposition of silicon oxide film-silicon nitride film-silicon oxide film (ONO). Alternatively, each intergate insulating film 5 may comprise a high dielectric film such as alumina. Furthermore, a low-concentrated impurity diffusion layer (not shown) is formed as a source/drain region in a part of a surface layer located between the gate electrodes MG of each memory cell transistor Trm. A silicon oxide film 7 is formed as an interelectrode insulating film on the part of the silicon substrate 2 located between the gate electrodes MG. Furthermore, a cavity or void where nothing is formed, or an air gap is formed in a part of the silicon oxide film 7 located between the gate electrodes MG. An interlayer insulating film (not shown) is formed on the aforesaid silicon oxide film 7. A silicon nitride film (not shown) is formed as a barrier film on the interlayer insulating film. Furthermore, another interlayer insulating film (not shown) is formed on the aforesaid silicon nitride film.

A method of fabricating the foregoing configuration will now be described with reference to FIGS. 4 to 11. The features of the embodiment will mainly be described in the following. However, one or more steps described in the following may be eliminated if occasion demands, and one or more steps may be added if these steps are necessary to form the structure of another region not shown in the drawings.

Figure 4:
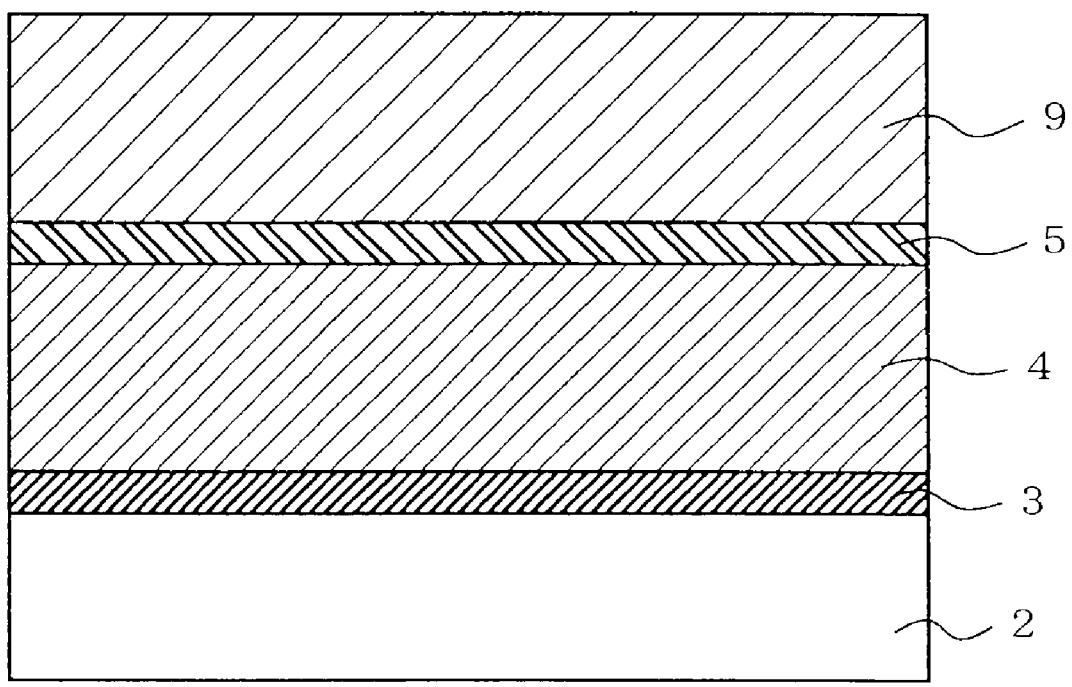
FIG. 4 is a schematic longitudinal side section, showing a stage of the fabricating process (No. 1)
Figure 5:
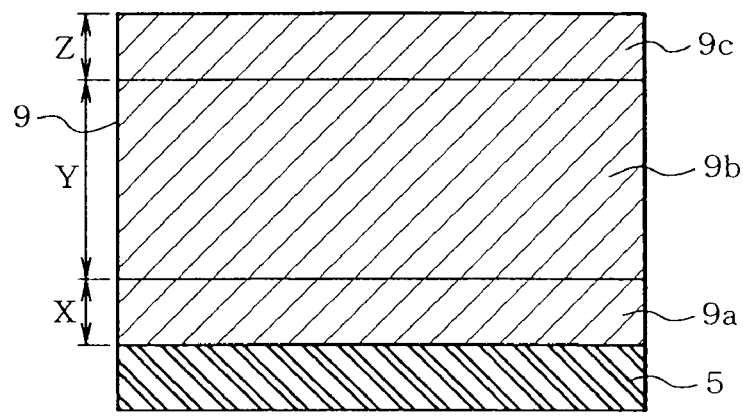
FIG. 5 is an enlarged schematic longitudinal side section of a polycrystalline silicon layer (amorphous silicon layer) for the forming of a control gate electrode CG.

Firstly, a thermal oxidation process is applied to the silicon substrate 2 so that the silicon oxide film 3 is formed, as shown in FIG. 4. Next, the polycrystalline silicon layer 4, the intergate insulating film 5 and a polycrystalline silicon layer 9 are sequentially formed by a low-pressure chemical vapor deposition (LPCVD) method. Here, the following will describe a process of forming the polycrystalline silicon layer 4 for the floating gate electrodes FG and the polycrystalline silicon layer 9 for the control gate electrodes CG with reference to FIG. 5. Although FIG. 5 illustrates the process of forming the control gate electrodes CG, the floating gate electrodes FG are formed by the same process as the control gate electrodes CG. An undoped amorphous silicon layer $9a$ is firstly formed on the intergate insulating film 5 so as to have a first film thickness of X nm, as shown in FIG. 5. The undoped amorphous silicon layer $9a$ is formed by causing a silane ($SiH_4$) gas to flow into a furnace heated at a temperature between 500 and 530° C. by an amount ranging from 200 to 1000 standard cc/min (sccm). Subsequently, a P-doped amorphous silicon layer $9b$ doped with phosphor (P) is formed on the undoped amorphous silicon layer $9a$ so as to have a predetermined film thickness Y nm. The P-doped amorphous silicon layer $9b$ is formed with supply of phosphine ($PH_3$) ranging from several to 200 sccm under the foregoing forming condition of the undoped amorphous silicon layer $9a$. Next, an undoped amorphous silicon layer $9c$ is formed on the P-doped amorphous silicon layer $9b$ so as to have a predetermined film thickness Z nm. The undoped amorphous silicon layer $9c$ is formed under the same forming condition as the undoped amorphous silicon layer $9a$.

Each of the polycrystalline silicon layers 4 and 9 comprises the undoped amorphous silicon layer interposed between the upper and lower doped amorphous silicon layers. In other words, each polycrystalline silicon layer is composed of upper and lower layers each of which comprises the undoped amorphous silicon layer and an intermediate layer comprising the P-doped amorphous silicon layer. The amorphous silicon layers $9a$, $9b$ and $9c$ may be formed continuously by the use of the same processing equipment or with suspension for every layer. Furthermore, the amorphous silicon layers $9a$, $9b$ and $9c$ may be formed by different equipments. When the forming of each layer is suspended or carried out by a plurality of different equipments, a native oxide can be formed in a boundary between adjacent layers. As a result, uniform diffusion of phosphor in the three layers can be suppressed when subsequent steps include a high-temperature process. The film thicknesses of the layers can be adjusted to respective desired values. The polycrystalline silicon layer 4 for the floating gate electrodes FG also comprises an undoped amorphous silicon layer, a P-doped amorphous silicon layer and an undoped amorphous silicon layer in the same manner as the polycrystalline silicon layer 9.

Subsequently, a silicon nitride film 10 is formed on the polycrystalline silicon layer 9 (amorphous silicon layers 9a, 9b and 9c). The silicon nitride film 10 serves as a hard mask for forming the polycrystalline silicon layer 4 (see FIG. 6). When the temperature is excessively increased in the forming of the silicon nitride film 10, there is a possibility that the dopant P may uniformly be diffused in each layer. In view of the problem, the silicon nitride film 10 is formed by a forming process at a low temperature of not more than 500° C. at which the dopant P cannot uniformly be diffused.

Figure 6:
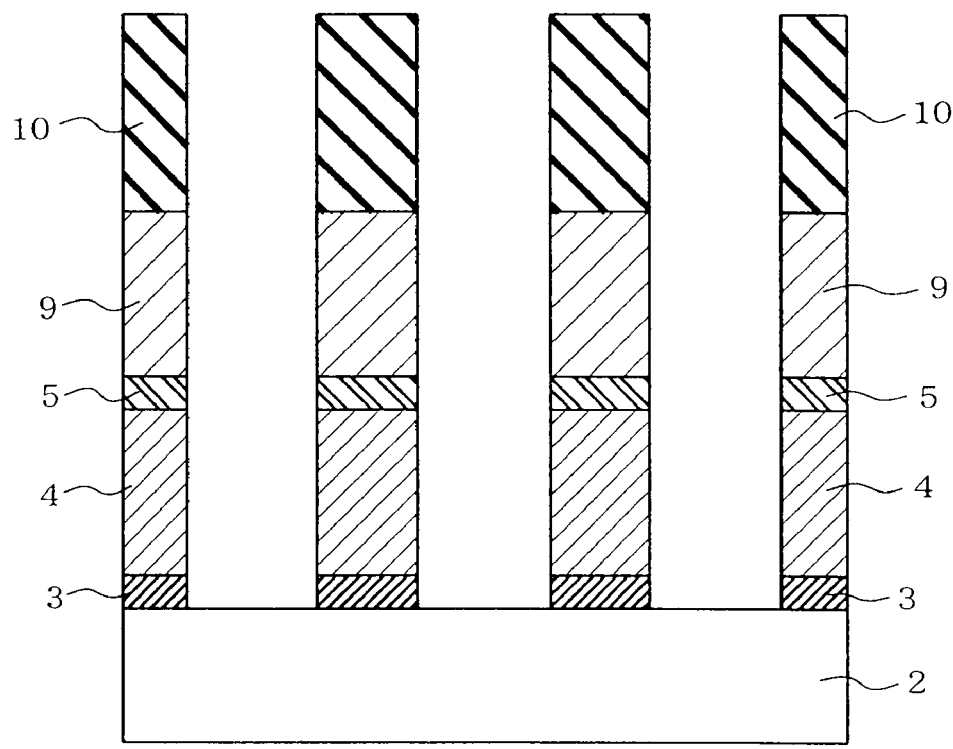
FIG. 6 is a schematic longitudinal side section, showing another stage of the fabricating process (No. 2)
Figure 7:
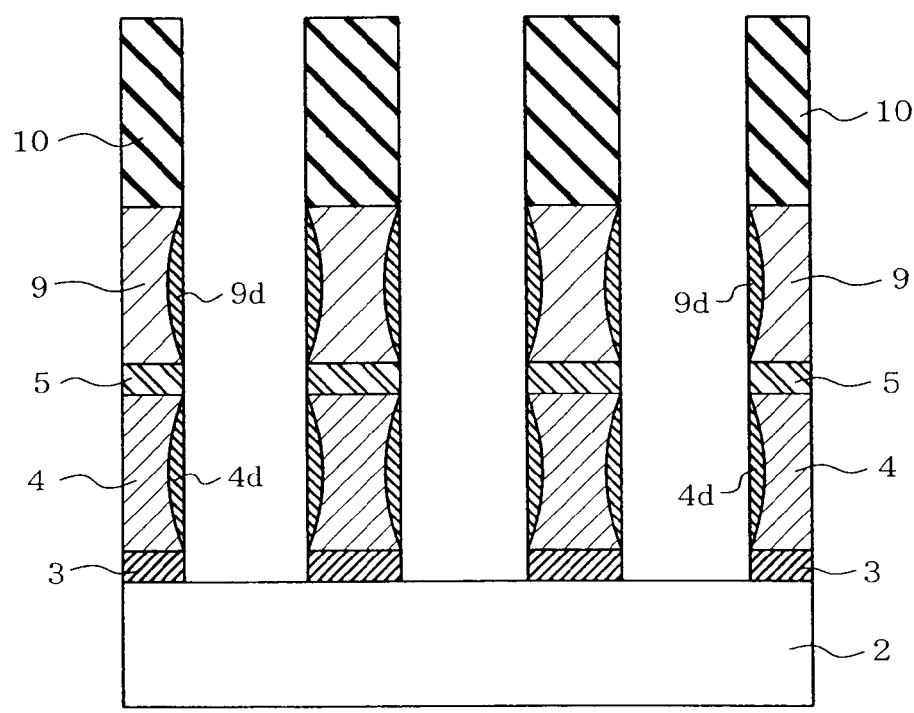
FIG. 7 is a schematic longitudinal side section, showing further another stage of the fabricating process (No. 3)

Subsequently, a resist (not shown) is applied to the silicon nitride film 10 to be patterned by the photolithography process. The silicon nitride film 10 is then processed by a dry etching process (a reactive ion etching (RIE) method) as shown in FIG. 6. Next, an etching process (RIE method) is carried out with the patterned silicon nitride film 10 serving as a mask, whereby the deposited film for the gate electrodes MG of the memory cell transistors is formed. The deposited film comprises the amorphous silicon layer (polycrystalline silicon layer) 9, intergate insulating film 5, amorphous silicon layer (polycrystalline silicon layer) 4 and silicon oxide film 3 (see FIG. 6). Next, the resist is removed. Alternatively, the resist may be removed immediately after the forming of the silicon nitride film 10. Additionally, the silicon oxide films 3 between the adjacent gate-electrode MG forming regions may remain although removed. Each of the formed polycrystalline silicon layers 4 and 9 has a dopant (P) concentration gradient that a concentration of the dopant (P) has a predetermined value and becomes smaller than the predetermined value as each approaches both ends thereof.

Subsequently, a thermal oxidation process is executed while both sides of each gate electrode MG (sides of each word line) are exposed. More specifically, the thermal oxidation process is executed at a temperature ranging from 950 to 1100° C. for a time period ranging 20 to 60 seconds under the atmosphere of oxygen. The amorphous silicon layers 4 and 9 are polycrystallized in the aforesaid process. Furthermore, the sides of the amorphous silicon layers 4 and 9 are oxidated in the aforesaid process. A degree of oxidation progress differs depending upon difference in the dopant (P) concentration in the oxidation. The amorphous silicon layers 4 and 9 include vertically intermediate portions having the predetermined dopant (P) concentrations respectively. The intermediate portions (regions designated by reference symbols 4d and 9d in FIG. 7) of the amorphous silicon layers 4 and 9 have maximum oxidated film thicknesses respectively. The oxidated film thicknesses are reduced as the amorphous silicon layers approach the upper and lower ends. The silicon oxide films are thus formed.

Figure 8:
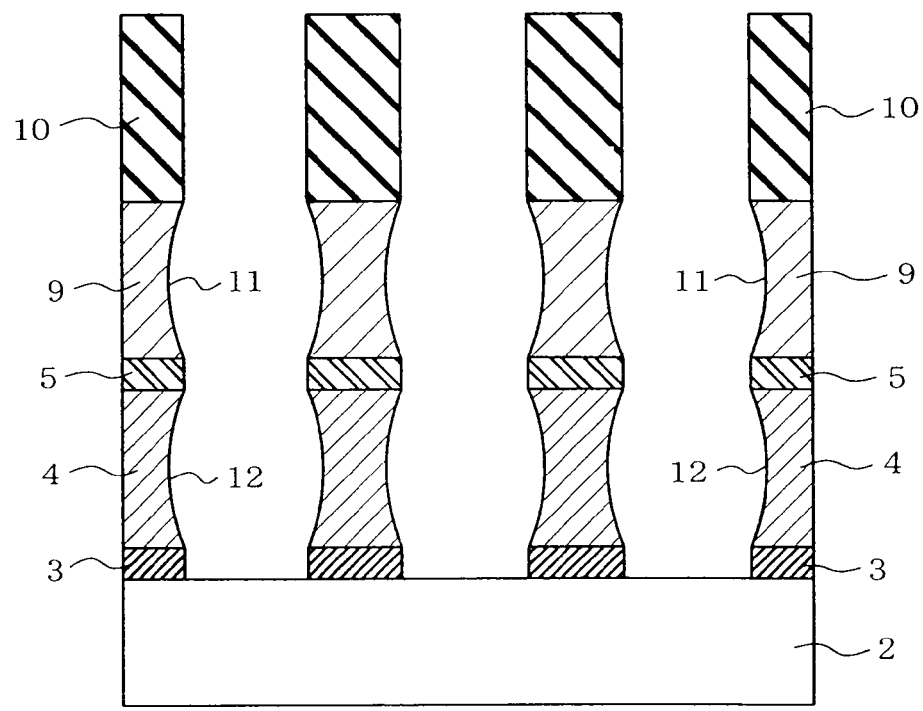
FIG. 8 is a schematic longitudinal side section, showing further another stage of the fabricating process (No. 4)

Subsequently, the silicon oxide films formed on the sidewalls of the floating and control gate electrodes FG and CG are selectively removed by an etching process with the use of the chemical solution, as shown in FIG. 8. As the result of this process, recesses 11 and 12 are formed in the sides of the control and floating gate electrodes 9 and 4 of the sides of the gate electrodes MG (that is, the sides of the word lines), respectively. Each of the recesses 11 and 12 has a generally shallow configuration and has a vertically deep intermediate portion and both shallower upper and lower ends. In other words, each gate electrode MG is formed so that vertically intermediate portions of the control and floating gate electrodes 9 and 4 have respective smaller gate widths than the upper and lower ends. When the recesses 11 and 12 are formed in the control and floating gate electrodes 9 and 4 of each gate electrode MG respectively, the distance between adjacent gate electrodes becomes maximum near the center of each electrode and is gradually reduced as each electrode approaches each of respective both ends.

Figure 9:
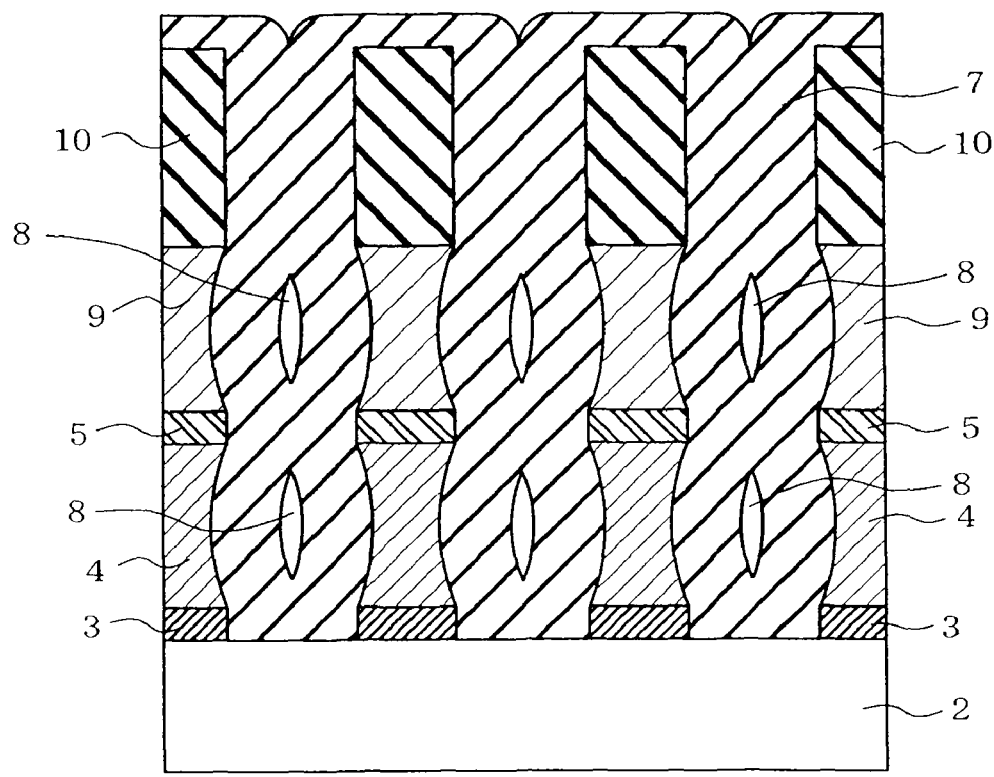
FIG. 9 is a schematic longitudinal side section, showing further another stage of the fabricating process (No. 5)

Subsequently, the silicon oxide films 7 are formed between the adjacent gate electrodes MG (that is, the word lines) by the LPCVD method as shown in FIG. 9. In this case, tetraethoxysilane (TEOS) is supplied by an amount ranging from 100 to 1000 sccm at a temperature ranging from 600 to 700° C., so that the silicon oxide films 7 are buried in spaces between the adjacent gate electrodes MG respectively. In the process, since each silicon oxide film 7 is formed uniformly along the adjacent sides of the gate electrodes MG, voids or air gaps 8 are finally formed in portions of each silicon oxide film 7 corresponding to the respective recesses 11 and 12.

Figure 10:
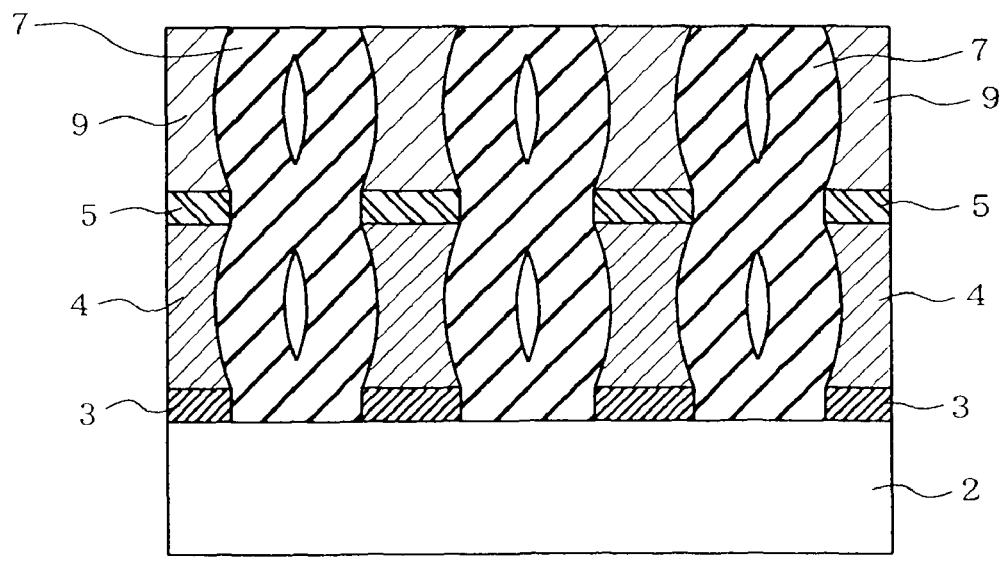
FIG. 10 is a schematic longitudinal side section, showing further another stage of the fabricating process (No. 6)
Figure 11:
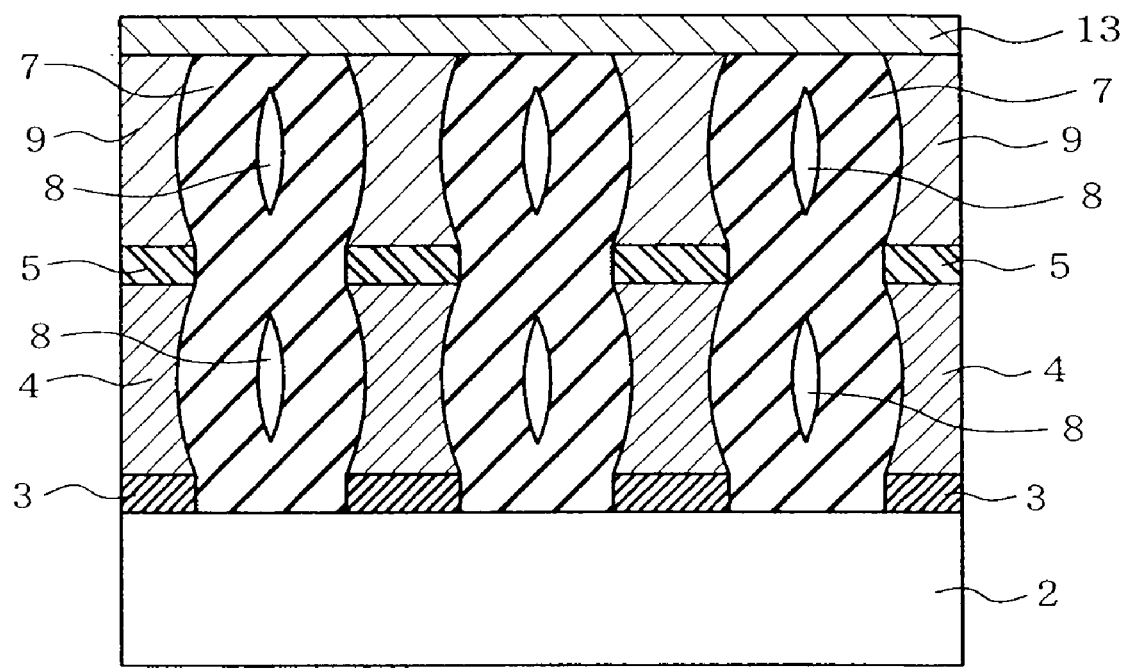
FIG. 11 is a schematic longitudinal side section, showing further another stage of the fabricating process (No. 7).

Subsequently, as shown in FIG. 10, each silicon oxide film 7 between the adjacent gate electrodes MG is partially removed, and the silicon nitride film 10 for the forming of the hard mask is also removed. Next, a metal film 13 is formed on the polycrystalline silicon layers 9 and the silicon oxide films 7 by sputtering as shown in FIG. 11. In this case, a metal such as Co, Ni, Ru or W is used as the metal film 13. Subsequently, the metal film 13 and the polycrystalline silicon layer 9 are combined with each other by heat treatment, whereby the metal silicide films 6 (see FIG. 3) for the control gate electrodes CG are formed. Thereafter, a metal stripping treatment is carried out to strip off an unreacted metal film 13. As a result, the configuration as shown in FIG. 3 is obtained.

According to the foregoing embodiment, the forming of the recesses 11 and 12 on the sides of the adjacent gate electrodes MG reliably results in the void in which no silicon oxide film 7 is present between the adjacent gate electrodes MG or the air gap in which no silicon oxide film 7 is buried. Consequently, the capacity between the adjacent memory cells between the gate electrodes MG can effectively be suppressed. Accordingly, a failure in data write or data readout can be prevented when data is written onto or read out of the memory cell. Particularly in the foregoing embodiment, the air gaps 8 having different depths, horizontal size and the like can be formed by suitably adjusting the P concentration profiles of the amorphous silicon layers 9 and 4.

The present invention should not be limited by the foregoing embodiment. The embodiment may be modified or expanded as follows. In the foregoing embodiment, the difference in the phosphor (P) concentration is provided between the amorphous silicon layers 4 and 9 when the recesses 11 and 12 are formed in the sides of each word line WL. The formed silicon oxide film is removed by the etching process with the use of the chemical solution while the difference in the oxidation speeds based on the difference in phosphor concentration is utilized, whereupon the recesses 11 and 12 are formed. However, the phosphor concentration difference may be provided between the amorphous silicon layers 4 and 9, and the recesses 11 and 12 may be formed by utilizing the difference in dry etching speeds based on the phosphor concentration difference.

More specifically, the steps up to the provision of the P concentration difference as shown in FIGS. 4 to 6 are the same as those in the foregoing embodiment. Subsequently, a dry etching process is carried out while the sides of the gate electrodes MG are exposed (in the state as shown in FIG. 6). In this case, the dry etching is carried out with the use of an octafluorobutene ($C_4F_8$) gas under the condition that a higher selectivity is given to the silicon substrate. In this process, a degree of progress in the dry etching differs between the amorphous silicon layers 9 and 4 for the forming of the control and gate electrodes CG and FG respectively depending upon difference in the internal P concentration between the layers. Accordingly, a region with higher P concentration is selectively dry etched, so that the configuration as shown in FIG. 8 is obtained. Subsequent steps (FIGS. 9-11 and 3) are the same as those as described above. As a result, the modified form achieves substantially the same effect as the foregoing embodiment.

Additionally, the invention should not be limited to the NAND flash memory but may be applied to NOR, AND and other types of nonvolatile semiconductor devices.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A semiconductor device comprising:
    a semiconductor substrate;
    a gate insulating film formed on an upper surface of the semiconductor substrate;
    a plurality of gate electrodes each of which includes a floating gate electrode formed on the gate insulating film, an intergate insulating film formed on the floating gate electrode, and a control gate electrode formed on the intergate insulating film; and
    a plurality of inter-electrode insulating films formed on portions of the semiconductor substrate located between the plurality of gate electrodes, wherein
    each floating gate electrode has an upper end, a lower end and an intermediate portion between the upper and lower ends and is formed so that the intermediate portion of each floating gate electrode has a smaller length in a gate-length direction than each of the upper and lower ends of each floating gate electrode;
    each control gate electrode has an upper end, a lower end and an intermediate portion between the upper and lower ends and is formed so that the intermediate portion of each control gate electrode has a smaller length in a gate-length direction than each of the upper and lower ends of each control gate electrode;
    each inter-electrode insulating film includes a first air gap portion formed in a first portion thereof corresponding to the intermediate portion of each floating gate electrode and a second air gap portion formed in a second portion thereof corresponding to the intermediate portion of each control gate electrode; and
    each floating gate electrode includes a first side wall having a first recess and each control gate electrode includes a second side wall having a second recess.

2. The device according to claim 1, wherein each floating gate electrode includes a first polycrystalline silicon layer and each control gate electrode includes a second polycrystalline silicon layer.

3. The device according to claim 2, wherein the first and the second polycrystalline silicon layers include vertical upper end portions, vertical lower end portions and vertical middle portions between the vertical upper and lower end portions, respectively, and the vertical middle portions of the first and the second polycrystalline silicon layers have a higher dopant concentration than the vertical upper and lower end portions of the first and the second polycrystalline silicon layers.

4. The device according to claim 1, wherein the first recess is formed so as to extend from an upper end portion to a lower end portion of the first side wall and the second recess is formed so as to extend from an upper end portion to a lower end portion of the second side wall.

5. The device according to claim 1, wherein the first recess is formed over the whole first side wall and the second recess is formed over the whole second side wall.

6. A semiconductor device comprising:
    a semiconductor substrate;
    a gate insulating film formed on an upper surface of the semiconductor substrate;
    a plurality of gate electrodes each of which includes a floating gate electrode formed on the gate insulating film, an intergate insulating film formed on the floating gate electrode, and a control gate electrode formed on the intergate insulating film; and
    a plurality of inter-electrode insulating films formed on portions of the semiconductor substrate located between the plurality of gate electrodes, wherein
    each floating gate electrode has an upper end, a lower end and an intermediate portion of each floating gate electrode between the upper and lower ends and is formed so that the intermediate portion of each floating gate electrode has a smaller length in a gate-length direction than each of the upper and lower ends of each floating gate electrode;
    each control gate electrode has an upper end, a lower end and an intermediate portion between the upper and lower ends and is formed so that the intermediate portion of each control gate electrode has a smaller length in a gate-length direction than each of the upper and lower ends of each control gate electrode;
    each inter-electrode insulating film includes a first air gap portion formed in a first portion thereof corresponding to the intermediate portion of each floating gate electrode and a second air gap portion formed in a second portion thereof corresponding to the intermediate portion of each control gate electrode;
    each floating gate electrode includes a first polycrystalline silicon layer and each control gate electrode includes a second polycrystalline silicon layer; and
    the first and the second polycrystalline silicon layers include vertical upper end portions, vertical lower end portions and vertical middle portions between the vertical upper and lower end portions, respectively, and the vertical middle portions of the first and the second polycrystalline silicon layers have a higher dopant concentration than the vertical upper and lower end portions of the first and the second polycrystalline silicon layers.

* * * * *